United States Patent [19]
Hethuin

[11] Patent Number: 4,947,354

[45] Date of Patent: Aug. 7, 1990

[54] MEASURING APPARATUS FOR DETECTING THE DISTANCE "H" TO AN OBJECT

[75] Inventor: Serge Hethuin, Meudon, France

[73] Assignee: U.S. Philips Corporation, New York, N.Y.

[21] Appl. No.: 255,812

[22] Filed: Oct. 11, 1988

[30] Foreign Application Priority Data

Oct. 16, 1987 [FR] France ................ 87 14289

[51] Int. Cl.[5] ................ G01S 13/34

[52] U.S. Cl. ................ 364/562; 342/122; 342/128; 364/433; 364/576

[58] Field of Search ................ 342/122, 128, 192, 196; 364/433, 562, 576

[56] References Cited

U.S. PATENT DOCUMENTS 3,577,143 5/1971 Poirier et al. ................ 342/192 X
4,443,792 4/1984 Pidgeon et al. ................ 342/192 X
4,509,049 4/1985 Haendel et al. ................ 342/122 X
4,568,938 2/1986 Ubriaco ................ 342/196 X
4,599,618 7/1986 Haendel et al. ................ 342/122 X
4,739,330 4/1988 Lazarus ................ 342/122
4,766,436 8/1988 Crepin et al. ................ 342/122
4,825,214 4/1989 Dejaeher ................ 342/128

*Primary Examiner*—Parshotam S. Lall
*Assistant Examiner*—Edward R. Cosimano
*Attorney, Agent, or Firm*—Robert J. Kraus

[57] ABSTRACT

A measuring apparatus for detecting the distance h to an object transmits and receives returns of a linearly frequency-modulated wave obtained by means of an oscillator (5) and a signal generator (7). A beat frequency signal is obtained by mixing the transmitted and received waves. The beat frequency signal at the output of mixer (22) is sampled and digitized by a signal sampler (30). The height "h" can be estimated by analyzing the frequency spectrum of this beat frequency wave. This spectrum is provided by the formula:

$$S(f) = \left| \frac{1}{1 + \sum_{i=1}^{p} a_i e^{-j2\pi i f}} \right|$$

in which formula the coefficients $a_i$ are those of a p-order predictor. This predictor provides a digital estimatin of a beat frequency wave sample on the basis of p previous samples.

3 Claims, 4 Drawing Sheets

MEASURING APPARATUS FOR DETECTING THE DISTANCE "H" TO AN OBJECT

BACKGROUND OF THE INVENTION

The present invention relates to a measuring apparatus for detecting the distance "h" to an object, the apparatus comprising a transmission circuit for transmitting in the direction of the object a wave exhibiting frequency-modulated periods, a receive circuit for receiving the wave reflected by the object, a mixer circuit for forming a beat frequency wave between the transmitted wave and the received wave and a processor element processing beat frequency wave samples for supplying the information of the distance "h" to the indicator.

Such devices are widely used in the field of radio navigation for measuring the altitude, the object then being the ground. Other applications can, for example, be the measuring of the height of the metal level in a blast-furnace.

An apparatus of this type is described in the U.S. Pat. No. 4,568,938.

This apparatus which directly performs a Fourier transform of the beat frequency wave samples is not very suitable for measuring a small distance. Actually, to avoid that in each period of the frequency modulation, the phase jumps of the beat signal distort the spectrum evaluated by the Fourier transform, only the samples of the beat signal obtained within a single modulation period are to be considered. To determine the small distances one is forced to take a high slope of the frequency modulation. A high slope variation cannot last very long and results in the processing of only a small number of samples. In this case, the Fourier transform proves to be inefficient.

SUMMARY OF THE INVENTION

The present invention has for its object to provide an apparatus of the type set forth in the premeable, particularly adapted to the case of low values for "h".

Thereto, such an apparatus is characterized in that the processor element comprises means to predict in adjustable coefficients "$a_i$" the value of a present sample, on the basis of "p" previous samples obtained in a same modulation period, error-detecting means to determine an error signal between the forecast sample and the present sample, adjusting means to influence the adjustable coefficients so as to minimize the error signal, spectral density calculating means to determine the spectrum lines of the beat frequency wave samples on the basis of the coefficients "$a_i$" and means to determine the distance information to be supplied to the indicator on the basis of the said lines.

BRIEF DESCRIPTION OF THE DRAWING

From the following detailed description, when considered with the accompanying drawings all given by way of non-limitative examples, it will become apparent how the invention can be realized. Herein.

DESCRIPTION OF THE PREFERRED EMBODIMENT

Figure 1:
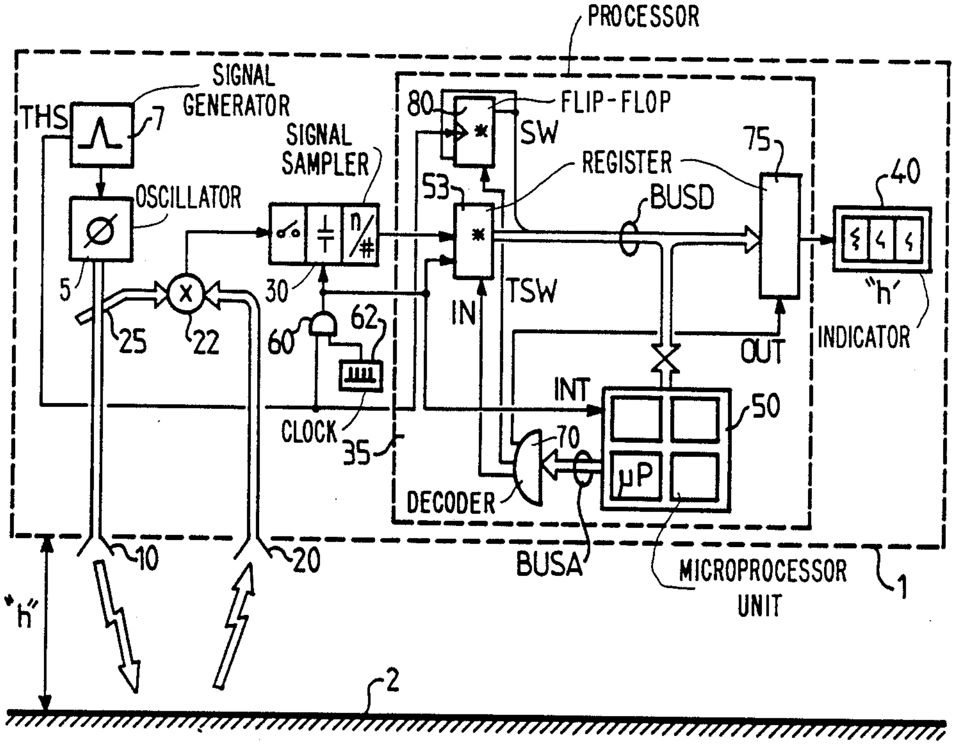
FIG. 1 shows an apparatus in accordance with the invention.

In FIG. 1 the reference character 1 indicates the apparatus which is the object of the invention. The apparatus is placed at an altitude "h" from the ground 2. The apparatus comprises a transmission circuit formed on the basis of a very-high frequency oscillator 5 which has a frequency controller receiving the saw-toothed signals furnished by a generator 7. The wave processed by the oscillator 5 is transmitted to ground 2 via a transmitting aerial 10.

The receive circuit comprises first and foremost a receive aerial 20 for receiving the wave reflected by the ground 2 and a mixer circuit 22 having two inputs; one of its inputs being connected to the flare of the receive aerial 20 and the other to the output of the oscillator 5 via a coupler 25 that samples for the mixer circuit 22 a small part of the transmitted wave. The beat frequency wave at the output of the mixer circuit is converted into digital samples by a signal sampler 30 comprising a sampling switch and an analogue-to-digital converter. A processor 35 operates on the samples furnished by the sampler 30 and supplies information that can be used by an indicator 40; thus, the value "h" is made visible to the user.

According to the invention, the apparatus for measuring the nearest return comprises a processor 35 which includes means for:

producing from p adjustable coefficients $a_i$ a sample y(n) which is a prediction of the sample x(n) of the beat frequency wave of the instant n.Ts (n=integer and TS=sampling period), this sample y(n) being processed by means of "p" former samples of the beat frequency wave obtained on the basis of a same saw-tooth, that is to say x(n−1), x(n−2), . . . x(n−p) so that the sample can be described as:

$$y(n) = -\sum_{i=1}^{p} a_i\,x(n-i) \qquad (1)$$

determining an error signal e(n) occurring between the forecast sample and the sample present, that is to say:

$$e(n)=x(n)-y(n) \qquad (2)$$

adjusting the coefficients "$a_i$" so as to minimize the error signal; therefore, for example the gradient algorithm is used and the coefficients are adjusted iteratively according to the following formula $$a_i^{n+1}=a_i^n-\mu e(n)x(n-i) \text{ where } i=1 \text{ to } p \qquad (3)$$

where $\mu$ is a constant representing the gradient step, thus determining the convergence speed and the variation of the residual error signal; its value generally being comprised between $0<\mu<1$, and n defines the instant at which it is used calculating the power-density spectrum S(f) for determining the spectrum lines (f) of the beat frequency wave samples provided on the basis of the coefficients $a_i$ according to the formula:

$$S(f) = \frac{1}{\left|1+\sum_{i=1}^{p} a_i\,e^{-j2\pi i f2}\right|} \qquad (4)$$

-continued where $j = \sqrt{-1}$, $f = m f_e/N = m/N \cdot TS$ m is an integer representing the number of the spectrum line of the N spectrum lines which are 1/N.TS apart.

and determining the distance information to be supplied to the indicator on the basis of the spectral density lines (for example, one may take the line with the strongest amplitude).

The aforementioned processor 35 includes microprocessor unit 50; the data supplied by the sampler 30 is conveyed by a register 53 whose three-state output is connected to the common data line BUSD of the microprocessor unit 50.

The data processed by the sampler 30 is progressively stored in the register 53 at the clock rate appearing at the output of an AND gate 60. To one of the two inputs of this gate 60 are applied the signals from a clock 62 determining the sampling frequency $f_e$ equal to 1/TS. To the other input is applied a signal THS derived from the generator 7 to make gate 60 passable for the period T during which the sawtooth is generated (see FIG. 2). The signals from gate 60 are also applied to the input INT of the unit 50, to be able to start an interrupt program that allows to store samples conveyed via the register 53 into the internal memory of the unit 50. Thereto, the unit 50 generates, via a decoder 70 connected to the common line of the address code BUSA of the unit 50, an IN signal to make the output of the register 53 assume the passing state. This decoder 70 furnishes an OUT signal for a register 75 whose input is connected to the BUSD line and whose output is connected to the indicator 40. The unit 50 generates, still via the decoder 70, a TSW signal to make the output of a flip-flop 80 (three-state) assume the passing state. This flip-flop receives on its input the THS signal from the generator 7. Thus, the output signal SW of this flip-flop changes its state at each beginning of the sawtooth.

Before embarking on a more detailed explanation of the operation of the apparatus according to the invention, the following considerations have to be made:

Let the coefficients $a_i$ be adjusted so that the error signal e(n) behaves like minimum-energy white noise. Let us assume that E(Z) is the Z transform of this error signal e(n), that is to say that the following relationship is obtained:

$$E(Z)*E(Z-1)=K^2 \quad (5)$$

where * represents a convolution.

If now the Z transform of the equation (2) is taken we obtain:

$$E(Z)=X(Z)-H(Z)\cdot X(Z) \quad (6)$$

where H(Z) is the transfer function of the predictor:

$$H(Z)=-a_1Z^{-1}- \ldots -a_pZ^{-p} \quad (6bis)$$

and X(Z) is the Z-transform of the samples x(n). Assuming that A(Z) is a function so that $$A(Z) = \frac{E(Z)}{X(Z)} \quad (7)$$

which, taking (6) and (6bis) into account, is written as:

$$A(Z) = \sum_{i=0}^{p} a_i Z^{-1}, \text{ with } a_0 = 1, \quad (8)$$

rewriting (7) we have:

$$X(Z) = \frac{E(Z)}{A(Z)} \quad (9)$$

from which the spectral density S(f), taking account of (5), can be written as $$S(f) = |X(f)|^2 = \frac{K^2}{A(f)^2} \quad (10)$$

when replacing Z by $e^{j2\pi f}$.

In the annex a method is given which allows to calculate S(f) in an easy way as a function of the coefficients $a_i$.

Now it is possible to explain in more detail the operation of the apparatus according to the invention.

Figure 2:
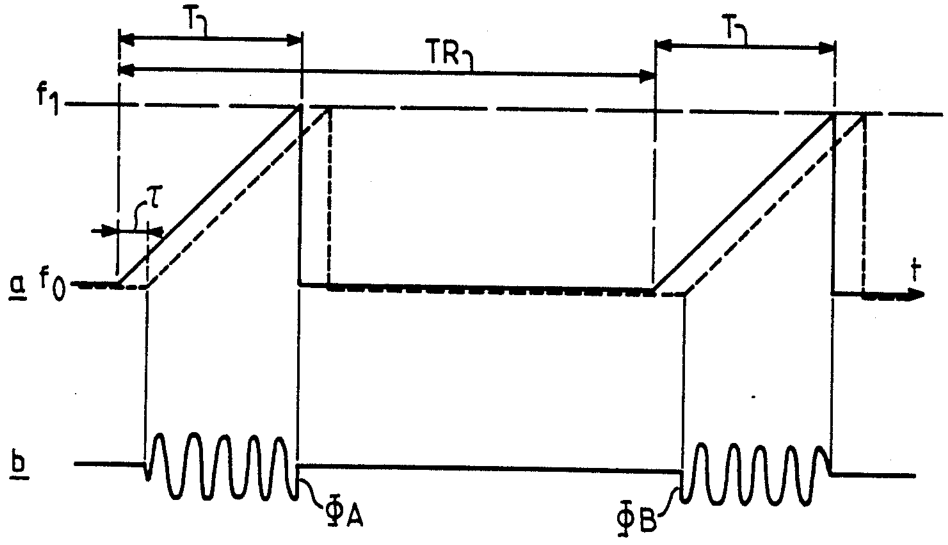
FIG. 2 shows the shape of the frequency change of the transmitted wave and the formation of the beat frequency wave.

In FIG. 2 at a are represented the frequency variations of the output signal of oscillator 5 and at b is represented the amplitude of the beat frequency wave at the output of circuit 22, these signals shown at a and b developing as a function of time "t". During a time period T (for example 64 μS), the frequency of the wave from oscillator 5 passes from $f_0$=4.800 GHz to $f_1$=4.825 GHz. This same variation is again found after a time period TR (for example of the order of 150 μS). These variations are represented in solid lines. In a dashed line, in an exaggerated form are represented the variations in the frequency of the received signal which are shifted by a period τ. It will be recollected that this period τ is connected to the distance "h" by the formula:

$$\tau = \frac{2h}{c} \quad (11)$$

where c is the speed of the light and, like the frequency fb of the beat signal at the output of the mixer circuit 22, is connected to this delay τ according to the formula:

$$\frac{fb}{\tau} = \frac{f_1 - f_0}{T} \quad (12)$$

the distance "h" will be obtained from $$h = \tfrac{1}{2} \cdot fb \cdot \frac{T}{(f_1 - f_0)} \cdot c \quad (13)$$

Since all the parameters of the formula (13) are constants, the processor element 35 is to determine the value "fb" which thus determines the distance "h". It should be observed that owing to discontinuities of the sawteeth, a phase coherence of the beat frequency wave cannot be ensured. Thus, in FIG. 2, at b, the phase φB of the beat frequency wave caused by the second sawtooth is practically in discontinuity with the phase φA of the beat frequency wave at the end of the first sawtooth. In order to avoid this disadvantageous effect, the element 35 unfolds a program in response to the above considerations. This program is divided into two parts: on the one hand the processing program of which the flowchart is represented in the FIGS. 3, 4 and 5 and on the other hand the interrupt program shown in FIG. 6.

Figure 3:
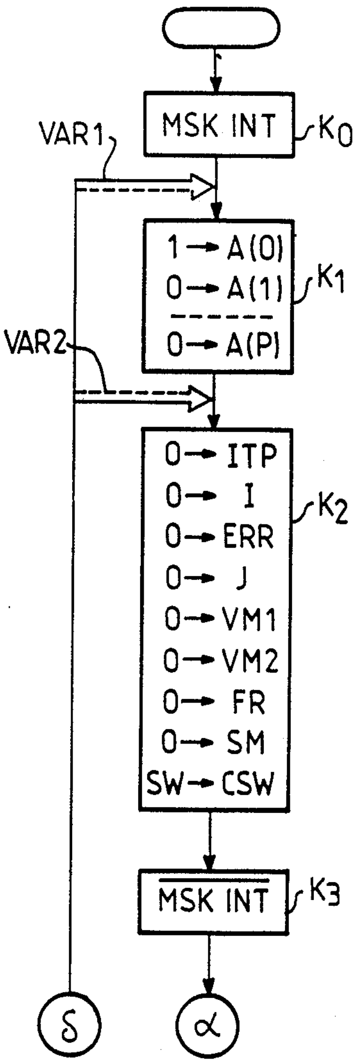
FIGS. 3, 4 and 5 show the flowchart of the processing program used by the invention.
Figure 6:
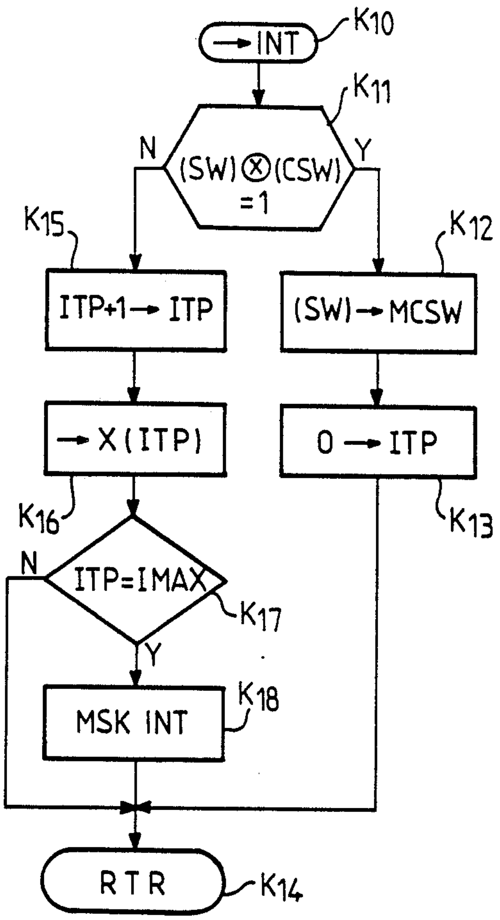
FIG. 6 shows the flowchart of the interrupt program used by the invention.

The flowchart of FIG. 3 relates to the initialization phase of the processing program. The box $K_0$ of this flowchart indicates the masked interruption, that is to say, the signals applied to the input INT of the unit 50 do not disturb this initialization phase; at block $K_1$ initial values of the predictor are given; the contents of memories A(i) can be easily indentified with the $a_i$ of formula (8) and it will be discerned that the initial coefficients all have the value "0" except for the coefficient $A_0$ contained in a(0) which has the value "1". The box $K_2$ indicates the initialization of different variables which will occur further in the program and which is not necessarily detailed here. This initialization phase ends at the box $K_3$ which produced a signal a and indicates the cancellation of the interruption masking, that is to say, the signals applied to the input INT initiate the interrupt program of which the flowchart is shown in FIG. 6.

Before embarking on the explanation of the phase of the processing program, a detailed description will be given of the operation of the interrupt program.

The box $K_{10}$ recalls that this part of the program commences when an active signal appears at the input INT. The box $K_{11}$ indicates a test of the contents of the trigger circuit 80. These contents are compared, while activating the TSW signal, with a value of the signal recorded previously, for example in the course of the initialization phase. For this test the exclusive-OR operation is carried out between the values SW and the contents of the memory CSW. The value 1 indicates wheter there is a change. If there is, box $K_{12}$ is proceeded to. At this box the new value SW is stored and the interrupt counter ITP is set to zero, at box $K_{13}$; box $K_{14}$, which then follows, indicates the end of the interrupt program. If the test of the box $K_{11}$ is negative, that is to say if the interruptions occur exactly in the same sawtooth, the latter are then counted by means of a counter ITP (box $K_{15}$) so that the samples of the register 53 will be arranged in a table X(ITP) whose addresses are a function of this counter ITP (box $K_{16}$). The test shown in box $K_{17}$ stops this arranging process the moment the counter reaches the value IMAX, for example of the order of 64; therefore, the interruption will be masked (box $K_{18}$) and the processing program (box $K_{17}$) will be returned to. If the count IMAX is not reached, box $K_{14}$ will directly be proceeded to.

Figure 4:
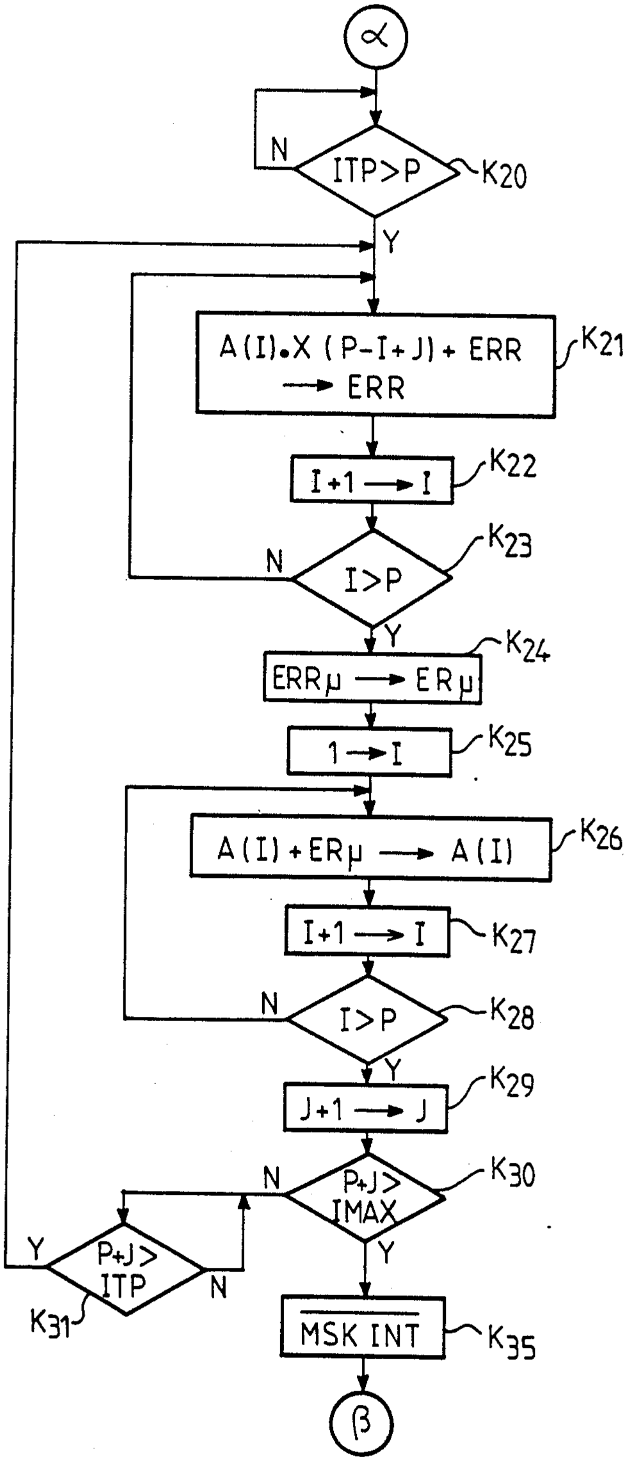
Figure 5:
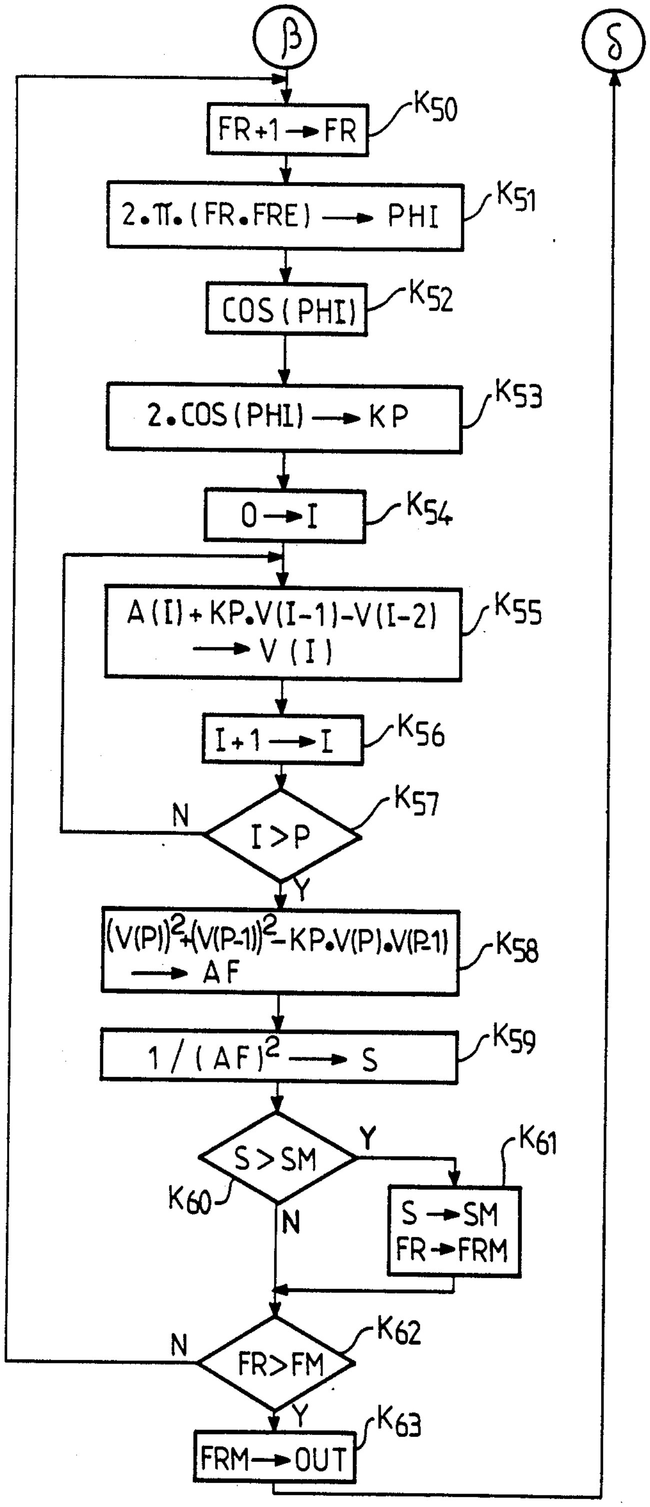

The phase of the processing program shown in FIG. 4 relates to the determination of the coefficients A(I). Before this phase is started, if box $K_{20}$ is receiving the signal $\alpha$ from box $K_3$, box $K_{20}$ tests whether there are sufficient samples in the table X(I), specifically, when the contents of the counter ITP are verified relative to the order P of the predictor; as long as the counting position is not reached, the test is repeated. When the counting position is reached, the process of computing the error signal is started (see formula (2) taking (1) into account) box $K_{21}$. This error signal accumulates in a memory ERR which in an advantageous manner could be the counter of the processor used. The argument $X{:}P-I+J$ should be observed, where incrementing I permits to call back ever later samples and J allows to bring the formula up to date with samples that are ever more recent. The boxes $K_{22}$ and $K_{23}$ determine when this computation of the error box $K_{21}$ is to be stopped for P successive samples. Box $K_{22}$ repeatedly increments by 1 the value of I, and box $K_{28}$ determines when I is greater than P.

In the box $K_{24}$ the correction constant is computed, as a function of the error signal (for computing the corrective term to modify the coefficients A(I)). An index I is initialized (box $K_{25}$) that will be used for addressing each of these coefficients A(I); the correction is indicated in box $K_{26}$. The boxes $K_{27}$ and $K_{28}$ allow to control the correction process for all the coefficients A(I). Then in the box $K_{29}$ the index J is incremented by one unit. It is then verified, box $K_{30}$, whether the table of the IMAX values of X(I) has been correctly processed in conformity with the test indicated in the box $K_{17}$ (FIG. 6); if this is the case, it is tested whether the argument $P+J$ of the table X(I) corresponds to a stored value (box $K_{31}$); if not, the test of the box $K_{31}$ is looped back to itself and it will become positive via the interrupt program. Thus, box $K_{21}$ is proceeded to for a new computation of the error signal "$e_n$". If the test of the box $K_{30}$ shows a positive result, box $K_{35}$ is proceeded to which indicates the masking of the interruptions by producing a signal $\beta$ to initiate operation of box $K_{50}$ (see FIG. 5). The interruptions no longer intervene in the course of the processing program.

The operation indicated at the box $K_{50}$ shows the presence of a variable FR which relates to the analysis rate. At box $K_{51}$ a value PHI is determined which is to be made identical with the value "$2\pi f$" of the formula A11 (see annex); the represented value FRE is to be made identical with $f_e/N$ like FR is to be made identical with m, subsequently, the cosine is computed (box $K_{52}$) which is effected by means of a preference table, that is to say that different values for cos PHI have been determined previously and that the computed value PHI provides the address of the cosine value according to the table. Then, this value is multiplied by two (box $K_{53}$) for constituting a constant KP which will occur in the process of the computation. At box $K_{54}$ an index I is set to zero before the computation indicated at box $K_{55}$ is effected which is the application of the formula A13. The operations indicated at boxes $K_{56}$ and $K_{57}$ allow to work out the formula A13 for all the coefficients A(I). Box $K_{56}$ repeatedly increments by 1 the value of I, and box $K_{57}$ repeatedly initiates the computation performed by box $K_{55}$ until the value of I is greater than P. When the value of I exceeds P, box $K_{57}$ initiates operation of box $K_{58}$. The box $K_{58}$ explains the calculation of the formula A14. The value S of the box $K_{59}$ is to be brought nearer to the value X(f) of the formula A15. This value S represents the amplitude of a spectrum line whose rank is given by the value FR. A memory denoted SM will be utilized for containing the maximum value of the amplitudes of the frequency lines whose ranks are comprised between (FR, . . . FM) and a memory FRM for containing the rank value given by this maximum value (see boxes $K_{60}$ and $K_{61}$). The test shown at box $K_{62}$, if $FR>FM$, stops the process of looping back to the box $K_{50}$ and the value FM is applied to the indicator 40 via register 75. Therefore, the OUT signal $\delta$ is activated (box $K_{63}$), upon which, according to a first variant of the invention, box $K_1$ is returned to (arrow VAR1), for starting again another processing operation of different samples while always taking the values 1 or 0 for the prediction coefficients. According to another variant, box $K_2$ is returned to (arrow VAR2), specifically, the prediction coefficients are initialized by the previously determined values.

ANNEX

Calculation of:

$$|X(f)|^2 = \frac{1}{\left|1 + \sum_{i=1}^{p} a_i Z^{-i}\right|} \quad \text{(A1)}$$

where $Z = e^{j2\pi f}$ with $f = m\, f_e/N$.

First stage: calculation of A(Z)

$$(A)Z = \sum_{i=0}^{p} a_i Z^{-i} \quad \text{with } a_0 = 1. \quad \text{(A2)}$$

$(A)Z = Z^{-p}\{((\ldots(a_0 Z + a_1)Z + a_2)Z + \ldots + a_{p-1})Z + a_p\}$

Then stating that $r_i = r_{i-1} Z + a_i$ with $r_0 = a_0$ (A3)

(A3) can be written as: $r_i = r_{i-1} e^{j2\pi f} + a_i$ (A4)

or $r_{i-1} = r_{i-2} e^{j2\pi f} + a_{i-1}$ (A5)

or also $r_{i-1} e^{-j2\pi f} = r_{i-2} + a_{i-1} e^{-j2\pi f}$ (A6)

Working out the difference between the equations (A4) and (A6) we obtain:

$r_i - r_{i-1} e^{-j2\pi f} = a_i - a_{i-1} e^{-j2\pi f} + r_{i-1} e^{j2\pi f} - r_{i-2}$ (A7)

from which:

$r_i = a_i - a_{i-1} \cdot e^{-j2\pi f} + 2\cos(2\pi f) r_{i-1} - r_{i-2}$ (A8)

Assuming that:

$r_i = v_i - e^{-j2\pi f} v_{i-1}$ (A9)

then:

$$v_i - e^{-j2\pi f} \cdot v_{i-1} = a_i - a_{i-1} \cdot e^{-j2\pi f} + 2\cos(2\pi f) - (v_{i-1} - e^{-j2\pi f} \cdot v_{i-2}) - (v_{i-2} - e^{-j2\pi f} \cdot v_{i-3})$$

$$v_i - e^{-j2\pi f} \cdot v_{i-1} = a_i + 2\cos(2\pi f) \cdot (v_{i-1} - v_{i-2}) - e^{j2\pi f} \cdot (a_{i-1} + 2\cos(2\pi f) v_{i-2} - v_{i-3}) \quad \text{(A10)}$$

Via identification we find:

$v_i = a_i + 2\cos(2\pi f)\, v_{i-1} - v_{i-2}$ (A11)

now $r_p = v_p - e^{-j2\pi f} v_{p-1}$ and $|A(Z)| = |r_p|$ which results in:

$|A(Z)|^2 = (v_p - \cos(2\pi f)\, v_{p-1})^2 + (\sin 2\pi f \cdot v_{p-1})^2$ (A12)

$|A(Z)|^2 = v_p^2 + v_{p-1}^2 - 2\cos(2\pi f) \cdot v_p \cdot v_{p-1}$

The algorithm can be processed in two stages, for each wanted line f of rank m:

first stage: as initial conditions are taken:

$v_{-1} = 0$ $v_{-2} = 1$ second stage: for all p coefficients, that is to say for $i = 0, \ldots p$, $v_i = a_i + 2\cos(2\pi m) \cdot v_{i-1} - v_{i-2}$ (A13)

$|A(f)|^2 = v_p^2 + v_{p-1}^2 - 2\cos(2\pi f) \cdot v_p - v_{p-1}$ (A14)

are worked out

ANNEX-continued

Second stage:

For each line f of rank m the following operation is performed:

$$|X(f)|^2 = \frac{1}{|A(f)|^2}$$

What is claimed is:

1. A measuring apparatus for detecting the distance h to an object, said apparatus comprising transmitting means for transmitting toward the object a wave having frequency modulated periods, receiving means for receiving a reflection of the wave from the object, mixing means coupled to the transmitting and receiving means for forming a beat frequency signal including information representative of the distance h, means for producing a plurality of samples of said beat frequency signal for each of said periods, and a processor for producing a signal representative of the distance h, characterized in that the processor comprises means for:

a. producing from p previous samples during one of said periods adjustable coefficients $a_i$ representing the predicted value of a present sample;

b. producing an error signal representative of the difference between the value of the present sample and the predicted value of said sample;

c. adjusting the values of the coefficients $a_i$ to minimize the magnitude of the error signal;

d. determining from the adjusted coefficients $a_i$ a power density spectrum for the beat frequency signal; and e. determining from the power density spectrum the distance h.

2. A measuring apparatus as in claim 1 where the processor includes storage means for containing initial values of the coefficients $a_i$, said initial values being identical for all of said periods.

3. A measuring apparatus as in claim 1 where the processor includes storage means for containing initial values of the coefficients $a_i$ for each period, said initial values being identical to the adjusted values obtained for a previous period.

* * * * *